United States Patent
Zhan

(10) Patent No.: US 11,114,871 B2
(45) Date of Patent: Sep. 7, 2021

(54) SMART WEARABLE DEVICE AND CHARGER THEREOF

(71) Applicant: JRD Communication Inc., Shenzhen (CN)

(72) Inventor: Wangfa Zhan, Shenzhen (CN)

(73) Assignee: JRD Communication Inc., Shenzhen (CN)

( * ) Notice: Subject to any disclaimer, the term of this patent is extended or adjusted under 35 U.S.C. 154(b) by 218 days.

(21) Appl. No.: 16/485,791

(22) PCT Filed: May 27, 2017

(86) PCT No.: PCT/CN2017/086410
§ 371 (c)(1),
(2) Date: Aug. 14, 2019

(87) PCT Pub. No.: WO2018/149050
PCT Pub. Date: Aug. 23, 2018

(65) Prior Publication Data
US 2020/0052513 A1 Feb. 13, 2020

(30) Foreign Application Priority Data

Feb. 14, 2017 (CN) .......................... 201710079140.6

(51) Int. Cl.
*H02J 7/00* (2006.01)
*H05K 7/14* (2006.01)
*H01R 13/24* (2006.01)

(52) U.S. Cl.
CPC ........ *H02J 7/0044* (2013.01); *H01R 13/2414* (2013.01); *H02J 7/00* (2013.01); *H05K 7/1427* (2013.01)

(58) Field of Classification Search
CPC .. H02J 7/0044; H02J 7/0042; H01R 13/2414; H05K 7/1427
(Continued)

(56) References Cited

U.S. PATENT DOCUMENTS 7,398,151 B1 * 7/2008 Burrell et al. ..... A63B 24/0062
342/357.75
7,513,019 B2 * 4/2009 Friedman et al. ..... H04B 1/385
24/265 WS
(Continued)

FOREIGN PATENT DOCUMENTS

CN 204349539 5/2014
CN 104146771 11/2014
(Continued)

OTHER PUBLICATIONS

International Search Report and the Written Opinion dated Sep. 28, 2017 From the International Searching Authority Re. Application No. PCTICN2017/086410 and Its Translation of Search Report Into English. (9 Pages).

*Primary Examiner* — Sun J Lin

(57) ABSTRACT

A smart wearable device and a charger thereof includes the smart wearable device and a charging base configured to charge the smart wearable device. The charging base comprises an elastic case. An open slot for inserting the smart wearable device is formed in the elastic case. A power supply portion is disposed on the charging base. The power supply portion provides the smart wearable device with electrical energy for charging. The smart wearable device is fixed to the charging base by way of a close fit between slot walls on two sides of the open slot and an outer surface of the smart wearable device.

18 Claims, 3 Drawing Sheets

(58) Field of Classification Search
USPC .......................................................... 320/107
See application file for complete search history.

(56) References Cited

U.S. PATENT DOCUMENTS

| | | | |
|---|---|---|---|
| 7,618,260 B2 | 11/2009 | Daniel et al. | |
| 8,249,547 B1 * | 8/2012 | Fellner .................. | H04B 1/385 |
| | | | 455/404.1 |
| 9,615,791 B2 | 4/2017 | Zhang et al. | |
| 10,742,048 B2 * | 8/2020 | Piercey et al. ........ | H02J 7/0042 |
| 2016/0021771 A1 | 1/2016 | Zhang et al. | |
| 2017/0346320 A1 * | 11/2017 | Jeong et al. ......... | H01R 13/642 |

FOREIGN PATENT DOCUMENTS

| | | |
|---|---|---|
| CN | 204231644 | 3/2015 |
| CN | 204930568 | 1/2016 |
| CN | 205283214 | 6/2016 |
| CN | 106026295 | 10/2016 |
| WO | WO 2018/149050 | 8/2018 |

\* cited by examiner

SMART WEARABLE DEVICE AND CHARGER THEREOF

RELATED APPLICATIONS

This application is a National Phase of PCT Patent Application No. PCT/CN2017/086410 having International filing date of May 27, 2017, which claims the benefit of priority of Chinese Patent Application No. 201710079140.6 filed on Feb. 14, 2017. The contents of the above applications are all incorporated by reference as if fully set forth herein in their entirety.

FIELD AND BACKGROUND OF THE INVENTION

The present disclosure relates to an electronic device, more particularly, to a smart wearable device and a charger thereof.

With the increasing number of types of electronic devices, smart wearable devices have gradually become familiar to people. The connection methods between the smart wearable devices in the related art and their charging bases are versatile. For example, a wireless method, a snap-fit method, a magnetic attraction method, and the like are used to connect so as to perform charging. These various methods have their respective advantages. The wireless method has flexibility and charging can be realized without a physical connection to the smart wearable device. The snap-fit method achieves a stable connection. The magnetic attraction method achieves a more accurate connection. However, these various methods all have a same problem, that is, the structure is complex. As a result, the service life cannot be guaranteed and the cost is high.

SUMMARY OF THE INVENTION

The present disclosure provides a smart wearable device and a charger thereof. As a result, the connection structure is simple, the connection is stable, and the cost is low.

The present disclosure provides a smart wearable device and a charger thereof. The smart wearable device and the charger thereof comprises the smart wearable device and a charging base configured to charge the smart wearable device. The charging base comprises an elastic case. An open slot for inserting the smart wearable device is formed in the case. A power supply portion is disposed on the charging base. The power supply portion provides the smart wearable device with electrical energy for charging. The smart wearable device is fixed to the charging base by way of a close fit between slot walls on two sides of the open slot and an outer surface of the smart wearable device.

Furthermore, cross sections of the slot walls on two sides of the open slot are concave curves, cross sections of the outer surface of the smart wearable device opposite to the slot walls on two sides of the open slot are convex curves to form joint portions, a radian of the joint portions is equal to a radian of the slot walls on two sides of the open slot.

Furthermore, a depth of the open slot is greater than one half of a thickness of the smart wearable device.

Furthermore, the power supply portion comprises a first printed circuit board (PCB) disposed in the case for charging. A pogo pin is connected to the first PCB. A spring hole for extension of ends of pin shafts of the pogo pin is formed in the case located on a bottom of the open slot. The pin shafts of the pogo pin extend into the open slot from the spring hole. Metal pillars that are in contact with elastic pieces on a second PCB of the smart wearable device are disposed in the smart wearable device. Pillar holes are formed in one side of an outer surface of the smart wearable device opposite to the bottom of the open slot. Positions of the pillar holes correspond to positions of the metal pillars. One end of each of the metal pillars away from the elastic piece is inserted into the pillar hole. The pin shafts of the pogo pin and end surfaces of the metal pillars away from the elastic pieces are brought into contact to conduct after the smart wearable device is inserted into the open slot so as to charge the smart wearable device.

Furthermore, a circumferential protruding portion is disposed at an upper end of the pogo pin. The protruding portion surrounds the pin shafts of the pogo pin. A shape and a size of the spring hole are adapted to a shape and a size of the protruding portion. Matching grooves are formed in the one side of the outer surface of the smart wearable device opposite to the bottom of the open slot and are located where the pillar holes are located. The matching grooves are adaptively connected to the protruding portion, the end surfaces of the metal pillars away from the elastic pieces extend into the matching grooves from the pillar holes.

Furthermore, a deformation slot is formed on another side of the case opposite to the open slot. Disposition directions of the deformation slot and the open slot are the same.

Furthermore, a supporting skeleton is disposed in the case.

Furthermore, the case is made of a thermal plastic and elastic material.

Furthermore, the case is made of polypropylene.

As compared with the related art, the present disclosure disposes a charging base having an open slot and having elasticity. The insertion method is adopted to allow the slot walls of the open slot and the outer surface of the smart wearable device to closely contact so as to achieve connection. A friction force is thus formed between the slot walls and the outer surface of the smart wearable device. As a result, the smart wearable device can be fixed to the charging base to perform charging. Not only is the reliable connection achieved, but the structure is also simple and the cost is also low.

DESCRIPTION OF SPECIFIC EMBODIMENTS OF THE INVENTION

Figure 1:
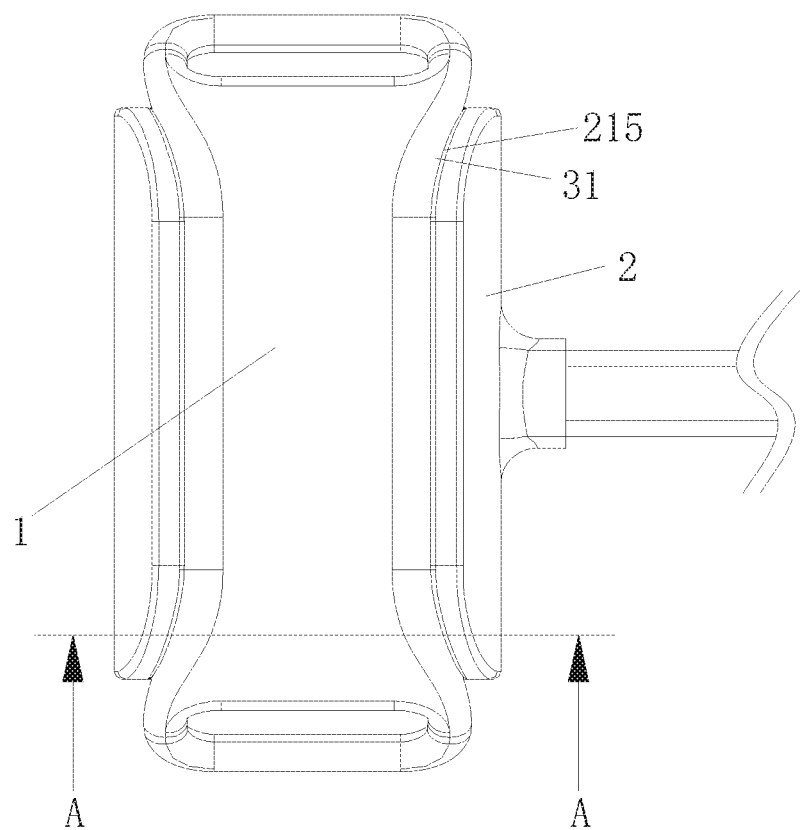
FIG. 1 is a schematic diagram of a connection structure of a smart wearable device according to the present disclosure.

The invention is described below in detail with reference to the accompanying drawings, wherein like reference numerals are used to identify like elements illustrated in one or more of the figures thereof, and in which exemplary embodiments of the invention are shown.

Figure 2:
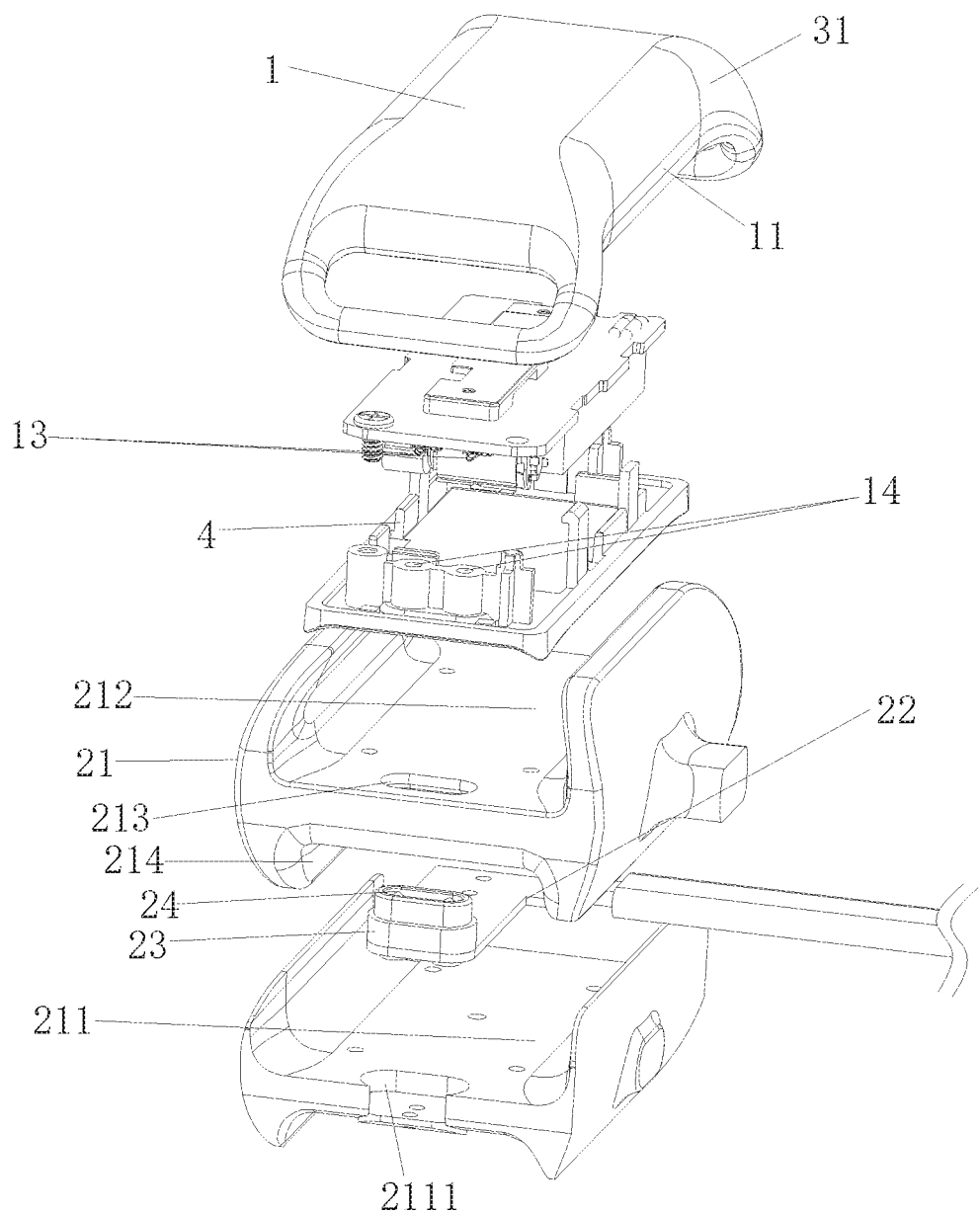
FIG. 2 is a schematic diagram of a three-dimensional decomposition structure according to the present disclosure.
Figure 3:
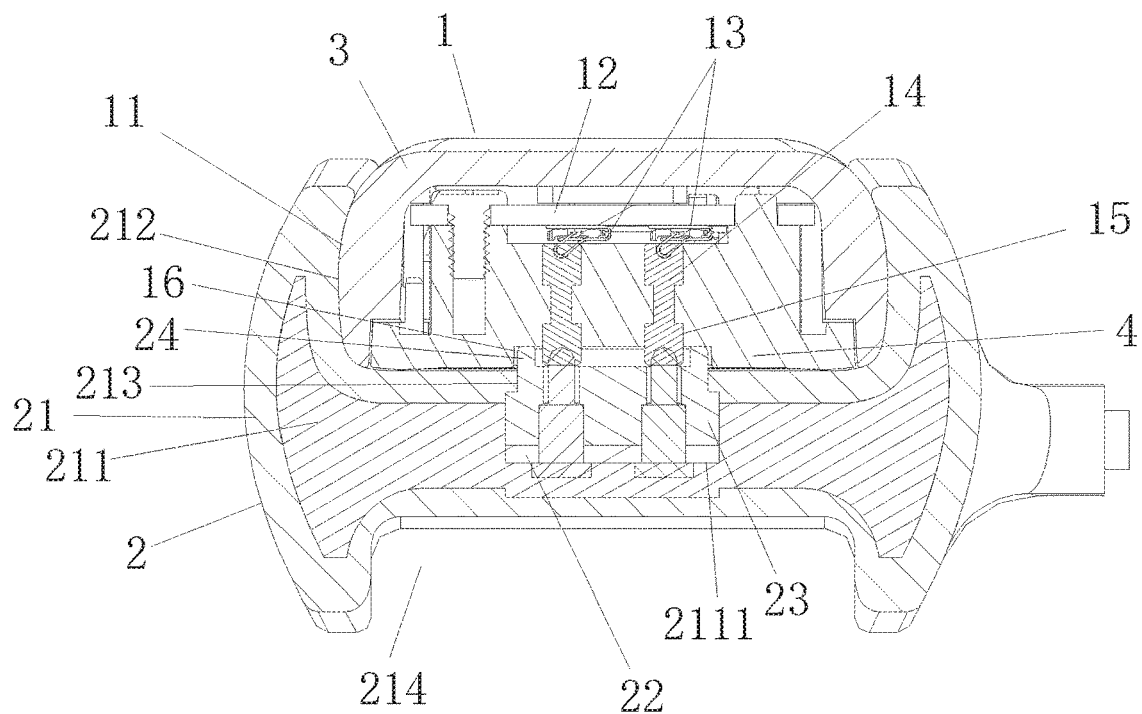
FIG. 3 is a cross-sectional view taken along line A-A of FIG. 1.

A description is provided with reference to FIG. 1, FIG. 2 and FIG. 3. A smart wearable device and a charger thereof according to the present disclosure comprises a smart wearable device 1 and a charging base 2 configured to charge the smart wearable device 1. According to the present disclosure, the charging base 2 has a power supply portion for supplying power to the smart wearable device 1. In addition, the power supply portion and a connection portion for matching the smart wearable device 1 and the power supply portion may be implemented by using a common charging port in the related art. The improvement of the present disclosure lies in the connection method between the smart wearable device 1 and the charging base 2.

The charging base 2 comprises an elastic case 21. The elastic case 21 is made of a material with more friction. An open slot 212 for inserting the smart wearable device 1 is formed in an upper surface of the case 21. A depth of the open slot 212 is greater than one half of a thickness of the smart wearable device 1. Through adjusting the depth of the open slot 212, a clamping force and a friction force of the open slot 212 can be adjusted to increase the fastness. The power supply portion is disposed on the charging base 2. The power supply portion provides the smart wearable device 1 with electrical energy for charging. The smart wearable device 1 is fixed to the charging base 2 by way of a close fit between slot walls on two sides of the open slot 212 and an outer surface of the smart wearable device 1.

As shown in FIG. 3, cross sections of the slot walls on two sides of the open slot 212 are concave curves to form a shape similar to a paw. In this manner, the fastness can be increased. Correspondingly, cross sections of the outer surface of the smart wearable device 1 opposite to the slot walls on two sides of the open slot 212 are convex curves to form joint portions. A radian of the joint portions 11 is equal to a radian of the slot walls on two sides of the open slot 212.

The power supply portion in the present disclosure may be realized by using the structure as follows. The structure comprises a first printed circuit board (PCB) 22 disposed in the case 21 for charging. A pogo pin 23 is connected to the first PCB 22. A spring hole 213 for extension of ends of pin shafts of the pogo pin 23 is formed in the case 21 located on a bottom of the open slot 212. The pin shafts of the pogo pin 23 extend into the open slot 212 from the spring hole 213.

As shown in FIG. 2 and FIG. 3, metal pillars 14 that are in contact with elastic pieces 13 on a second PCB 12 of the smart wearable device 1 are disposed in the smart wearable device 1. Pillar holes 15 are formed in one side of the outer surface of the smart wearable device 1 opposite to the bottom of the open slot 212. Positions of the pillar holes 15 correspond to positions of the metal pillars 14. One end of each of the metal pillars 14 away from elastic piece 13 is inserted into the pillar hole 15.

When being connected, the pin shafts of the pogo pin 23 and end surfaces of the metal pillars 14 away from elastic pieces 13 are brought into contact to conduct after the smart wearable device 1 is inserted into the open slot 212. As a result, the smart wearable device 1 is charged.

In order to avoid the mounting error of the smart wearable device 1 and the charging base 2, a circumferential protruding portion 24 is disposed at an upper end of the pogo pin 23. The protruding portion 24 surrounds the pin shafts of the pogo pin 23. A shape and a size of the spring hole 213 are adapted to a shape and a size of the protruding portion 24. Matching grooves 16 are formed in the one side of the outer surface of the smart wearable device 1 opposite to the bottom of the open slot 212 and are located where the pillar holes 15 are located. The matching grooves 16 are adaptively connected to the protruding portion 24. The end surfaces of the metal pillars 14 away from elastic pieces 13 extend into the matching grooves 16 from the pillar holes 15.

The smart wearable device 1 further comprises an upper case 3 and a lower case 4 disposed underneath the upper case 3. An accommodation space for placing the second PCB 12 is formed in the upper case 3. Functional components required by the smart wearable device 1, such as a battery, etc., may further be place in the accommodation space, but the present disclosure is not limited in this regard. The pillar holes 15 and the matching grooves 16 are all formed in the lower case 4. The lower case 4 and the upper case 3 are connected through hooks so as to close the accommodation space in the upper case 3. The joint portions 11 are disposed on the upper case 3.

According to the present disclosure, the pogo pin 23 is disposed on one side of the open slot 212 close to an edge of an opening of the open slot 212.

As shown in FIG. 3, a deformation slot 214 is formed on a bottom of the case 21 that is on another side of the case 21 opposite to the open slot 212. Disposition directions of the deformation slot 214 and the open slot 212 are the same. Opening of the open slot 212 can be easier when the smart wearable device 1 is placed into the open slot 212 of the charging base 2.

In greater detail, a depth of the deformation slot 214 is less than the depth of the open slot 212. Preferably, the depth of the deformation slot 214 is one half of the depth of the open slot 212.

A supporting skeleton 211 is disposed in the case 21. A shape of the supporting skeleton 211 is similar to a shape of the case 21. A groove 2111 for fixing the pogo pin 23 and the first PCB 22 is formed in the supporting skeleton 211 corresponding to a position of the pogo pin 23.

As shown in FIG. 1, first bending portions 215 are respectively disposed at two ends of each of the slot walls on two sides of the open slot 212. Second bending portions 31 are disposed on the upper case 3 of the smart wearable device 1 corresponding to positions of the first bending portions 215.

The case 21 is made of a thermal plastic and elastic material having considerable elasticity and flexibility. The supporting skeleton 211 is made of polypropylene.

Figure 4:
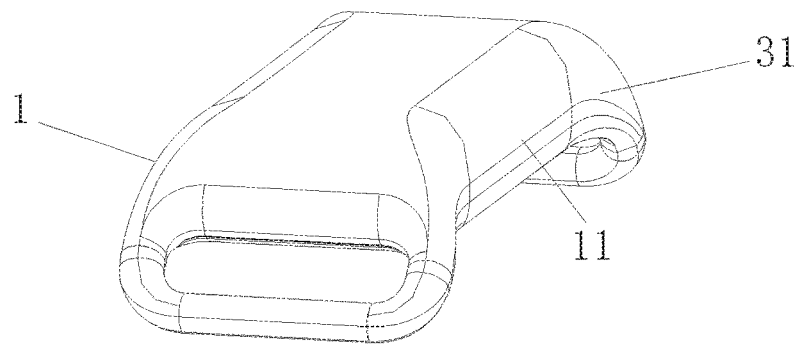
FIG. 4 is a schematic diagram of a service state of the present disclosure.
Figure 4:
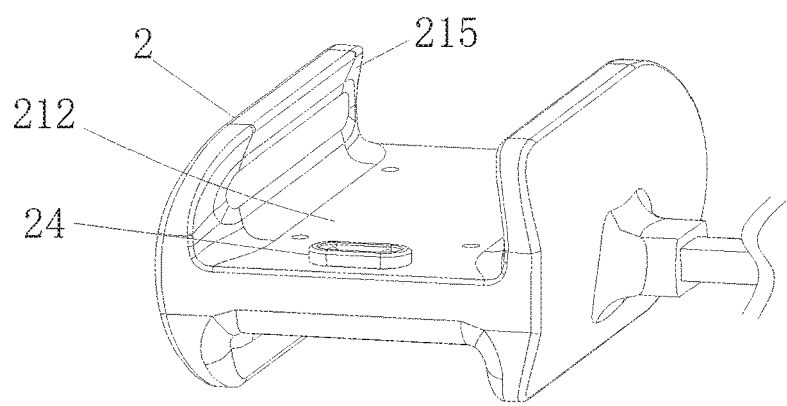

As shown in FIG. 3 and FIG. 4, the joint portions 11 of the smart wearable device 1 are aligned with the open slot 212 and are pushed into the open slot 212 hard when charging, so that the slot walls on two sides of the open slot 212 deform and flare. The first bending portions 215 at the two ends of each of the slot walls on two sides of the open slot 212 and the second bending portions 31 have the guidance effect. After the smart wearable device 1 completely enters into the open slot 212, the slot walls on two sides of the open slot 212 restore and contact the joint portions 11. The guidance effect of the first bending portions 215 and the second bending portions 31 allows the matching grooves 16 of the smart wearable device 1 to successfully join with the protruding portion 24, and also brings the pin shafts of the pogo pin 23 and the metal pillars 14 into contact so as to conduct. As a result, the charging is performed.

The smart wearable device 1 according to the present disclosure may be a smart bracelet, a smart watch, or the like.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A smart wearable device and a charger thereof comprising:

the smart wearable device; and
a charging base configured to charge a smart wearable device, the charging base comprising:
an elastic case;
an open slot, formed in the elastic case, for inserting the smart wearable device; and
a power supply portion disposed on the charging base and configured to supply the smart wearable device with electrical energy for charging;
wherein the smart wearable device is fixed to the charging base by means of a close fit between slot walls on two sides of the open slot and an outer surface of the smart wearable device;
wherein cross sections of the slot walls on the two sides of the open slot are concave curves; cross sections of the outer surface of the smart wearable device opposite to the slot walls on the two sides of the open slot are convex curves to form joint portions; a radian of the joint portions is equal to a radian of the slot walls on the two sides of the open slot;
wherein the smart wearable device comprises an upper case and a lower case disposed underneath the upper case; an accommodation space is formed in the upper case; the lower case and the upper case are connected through hooks so as to close the accommodation space in the upper case; the joint portions are disposed on the upper case;
wherein the power supply portion comprises a first printed circuit board (PCB) disposed in the elastic case for charging; a pogo pin is connected to the first PCB; a spring hole for extension of ends of pin shafts of the pogo pin is formed in the elastic case located on a bottom of the open slot; the pin shafts of the pogo pin extend into the open slot from the spring hole; metal pillars that are in contact with elastic pieces on a second PCB of the smart wearable device are disposed in the smart wearable device; the second PCB is disposed in the accommodation space; pillar holes are formed in one side of an outer surface of the lower case of the smart wearable device opposite to the bottom of the open slot; positions of the pillar holes correspond to positions of the metal pillars; one end of each one of the metal pillars away from one elastic piece of the elastic piece is inserted into a corresponding pillar hole of the pillar hole; the pin shafts of the pogo pin and end surfaces of the metal pillars away from the elastic pieces are brought into contact to conduct after the smart wearable device is inserted into the open slot so as to charge the smart wearable device.

2. The smart wearable device and the charger thereof as claimed in claim 1, wherein a depth of the open slot is greater than one half of a thickness of the smart wearable device.

3. The smart wearable device and the charger thereof as claimed in claim 2, wherein a circumferential protruding portion is disposed at an upper end of the pogo pin; the circumferential protruding portion surrounds the pin shafts of the pogo pin; a shape and a size of the spring hole are adapted to a shape and a size of the circumferential protruding portion; matching grooves are formed in the one side of the outer surface of the lower case of the smart wearable device opposite to the bottom of the open slot and are located at the pillar holes are located; the matching grooves are adaptively connected to the circumferential protruding portion; the end surfaces of the metal pillars away from the elastic pieces extend into the matching grooves from the pillar holes.

4. The smart wearable device and the charger thereof as claimed in claim 3, wherein a deformation slot is formed on another side of the elastic case opposite to the open slot, and disposition directions of the deformation slot and the open slot are the same.

5. The smart wearable device and the charger thereof as claimed in claim 4, wherein a supporting skeleton is disposed in the elastic case.

6. The smart wearable device and the charger thereof as claimed in claim 5, wherein the supporting skeleton is made of polypropylene.

7. The smart wearable device and the charger thereof as claimed in claim 3, wherein a supporting skeleton is disposed in the elastic case.

8. The smart wearable device and the charger thereof as claimed in claim 7, wherein the supporting skeleton is made of polypropylene.

9. The smart wearable device and the charger thereof as claimed in claim 1, wherein a circumferential protruding portion is disposed at an upper end of the pogo pin; the circumferential protruding portion surrounds the pin shafts of the pogo pin; a shape and a size of the spring hole are adapted to a shape and a size of the circumferential protruding portion; matching grooves are formed in the one side of the outer surface of the lower case of the smart wearable device opposite to the bottom of the open slot and are located at the pillar holes are located; the matching grooves are adaptively connected to the circumferential protruding portion; the end surfaces of the metal pillars away from the elastic pieces extend into the matching grooves from the pillar holes.

10. The smart wearable device and the charger thereof as claimed in claim 9, wherein a deformation slot is formed on another side of the elastic case opposite to the open slot, and disposition directions of the deformation slot and the open slot are the same.

11. The smart wearable device and the charger thereof as claimed in claim 1, wherein the elastic case is made of a thermal plastic and elastic material.

12. A smart wearable device and a charger thereof comprising:
the smart wearable device; and
a charging base configured to charge a smart wearable device, the charging base comprising:
an elastic case, made of a thermal plastic and elastic material;
an open slot formed in the elastic case, for inserting the smart wearable device; and
a power supply portion disposed on the charging base and configured to supply the smart wearable device with electrical energy for charging;
wherein the smart wearable device is fixed to the charging base by means of a close fit between slot walls on two sides of the open slot and an outer surface of the smart wearable device;
wherein cross sections of the slot walls on the two sides of the open slot are concave curves; cross sections of the outer surface of the smart wearable device opposite to the slot walls on the two sides of the open slot are convex curves to form joint portions; a radian of the joint portions is equal to a radian of the slot walls on the two sides of the open slot.

13. The smart wearable device and the charger thereof as claimed in claim 12, wherein a depth of the open slot is greater than one half of a thickness of the smart wearable device.

14. The smart wearable device and the charger thereof as claimed in claim 12, wherein the power supply portion comprises a first printed circuit board (PCB) disposed in the elastic case for charging; a pogo pin is connected to the first PCB; a spring hole for extension of ends of pin shafts of the pogo pin is formed in the elastic case located on a bottom of the open slot; the pin shafts of the pogo pin extend into the open slot from the spring hole, metal pillars that are in contact with elastic pieces on a second PCB of the smart wearable device are disposed in the smart wearable device; pillar holes are formed in one side of an outer surface of the smart wearable device opposite to the bottom of the open slot, positions of the pillar holes correspond to positions of the metal pillars; one end of each one of the metal pillars away from one elastic piece of the elastic pieces is inserted into a corresponding pillar hole of the pillar holes, the pin shafts of the pogo pin and end surfaces of the metal pillars away from the elastic pieces are brought into contact to conduct after the smart wearable device is inserted into the open slot so as to charge the smart wearable device.

15. The smart wearable device and the charger thereof as claimed in claim 14, wherein a circumferential protruding portion is disposed at an upper end of the pogo pin; the circumferential protruding portion surrounds the pin shafts of the pogo pin; a shape and a size of the spring hole are adapted to a shape and a size of the circumferential protruding portion, matching grooves are formed in the one side of the outer surface of the smart wearable device opposite to the bottom of the open slot and are located at the pillar holes are located; the matching grooves are adaptively connected to the circumferential protruding portion; the end surfaces of the metal pillars away from the elastic pieces extend into the matching grooves from the pillar holes.

16. The smart wearable device and the charger thereof as claimed in claim 15, wherein a deformation slot is formed on another side of the elastic case opposite to the open slot, and disposition directions of the deformation slot and the open slot are the same.

17. The smart wearable device and the charger thereof as claimed in claim 16, wherein a supporting skeleton is disposed in the elastic case.

18. The smart wearable device and the charger thereof as claimed in claim 17, wherein the elastic case is made of polypropylene.

* * * * *